(12) United States Patent
Jöckel et al.

(10) Patent No.: US 9,239,342 B2
(45) Date of Patent: Jan. 19, 2016

(54) DEVICE FOR MEASURING A SUPPLY VOLTAGE IN ELECTRIC VEHICLES

(75) Inventors: Wolfgang Jöckel, Gersfeld (DE); Timo Dietz, Hochheim am Main (DE); Thomas Gaertner, Berlin (DE); Helge Grasshoff, Regensburg (DE)

(73) Assignee: Continental Teves AG & Co. oHG (DE)

( * ) Notice: Subject to any disclaimer, the term of this patent is extended or adjusted under 35 U.S.C. 154(b) by 192 days.

(21) Appl. No.: 14/006,736

(22) PCT Filed: Mar. 29, 2012

(86) PCT No.: PCT/EP2012/055709
§ 371 (c)(1),
(2), (4) Date: Sep. 23, 2013

(87) PCT Pub. No.: WO2012/130990
PCT Pub. Date: Oct. 4, 2012

(65) Prior Publication Data
US 2014/0015513 A1    Jan. 16, 2014

(30) Foreign Application Priority Data
Mar. 29, 2011    (DE) .......................... 10 2011 006 377

(51) Int. Cl.
*G01R 19/00*    (2006.01)
*G01R 19/10*    (2006.01)
(Continued)

(52) U.S. Cl.
CPC .............. *G01R 19/10* (2013.01); *G01R 19/255* (2013.01); *G01R 31/3624* (2013.01);
(Continued)

(58) Field of Classification Search
CPC .............. H02M 1/00; H02J 1/00; H02P 1/00; H02P 2101/00; H02P 2201/00; G01D 1/00
See application file for complete search history.

(56) References Cited

U.S. PATENT DOCUMENTS 3,504,267 A    3/1970    James et al.
3,842,371 A    10/1974    Kelley
(Continued)

FOREIGN PATENT DOCUMENTS

BE                904066 A2    5/1986
DE    10 2009 019 277 A1    12/2009
(Continued)

OTHER PUBLICATIONS

International Search Report for PCT/EP2012/055709 mailed Jun. 22, 2012.
(Continued)

*Primary Examiner* — Huy Q Phan
*Assistant Examiner* — Temilade Rhodes-Vivour
(74) *Attorney, Agent, or Firm* — RatnerPrestia

(57) ABSTRACT

A sensor arrangement for measuring an electric voltage ($U_{term}$), wherein the potential point, at which the electric voltage relative to a defined electric potential, in particular relative to earth, is intended to be measured, is connected to a capacitor, to which a comparator unit is connected which ascertains whether a first defined threshold voltage ($U_{ref}$) is present at the capacitor, wherein the sensor arrangement is configured such that it provides an output signal which is dependent on at least one charging process of the capacitor and includes at least the information of the charging time for charging the capacitor to the first defined threshold voltage.

14 Claims, 1 Drawing Sheet

(51) Int. Cl.
  H02M 1/00 (2007.01)
  G01R 19/255 (2006.01)
  G01R 31/36 (2006.01)
  G01R 35/00 (2006.01)
  H02J 1/00 (2006.01)
  H02P 101/00 (2015.01)
  G01R 15/16 (2006.01)
  H03K 7/08 (2006.01)
  G01R 1/20 (2006.01)
  G01R 31/00 (2006.01)

(52) U.S. Cl.
  CPC ............... G01R 35/00 (2013.01); H02M 1/00 (2013.01); *G01R 1/203* (2013.01); *G01R 15/16* (2013.01); *G01R 19/0092* (2013.01); *G01R 31/006* (2013.01); *H02J 1/00* (2013.01); *H02P 2101/00* (2015.01); *H03K 7/08* (2013.01)

(56) References Cited

U.S. PATENT DOCUMENTS

| | | | |
|---|---|---|---|
| 3,968,447 A | 7/1976 | Baylac et al. | |
| 4,410,812 A | 10/1983 | Hönig et al. | |
| 2003/0178990 A1* | 9/2003 | Dufour | 324/207.2 |
| 2004/0017224 A1* | 1/2004 | Tumer et al. | 327/51 |
| 2008/0122454 A1* | 5/2008 | Kato | G01D 3/032 324/661 |
| 2009/0108914 A1* | 4/2009 | Zhang | H03K 17/962 327/517 |
| 2009/0134039 A1* | 5/2009 | Matthews | 205/354 |
| 2009/0153198 A1* | 6/2009 | Augustyniak | G11C 27/026 327/96 |
| 2009/0278545 A1 | 11/2009 | Magana et al. | |
| 2010/0188049 A1 | 7/2010 | Haddani et al. | |

FOREIGN PATENT DOCUMENTS

| | | |
|---|---|---|
| FR | 2 769 430 | 4/1999 |
| GB | 1 379 856 | 1/1975 |

OTHER PUBLICATIONS

German Search Report for DE 10 2012 205 154.6 mailed Dec. 21, 2012.

* cited by examiner

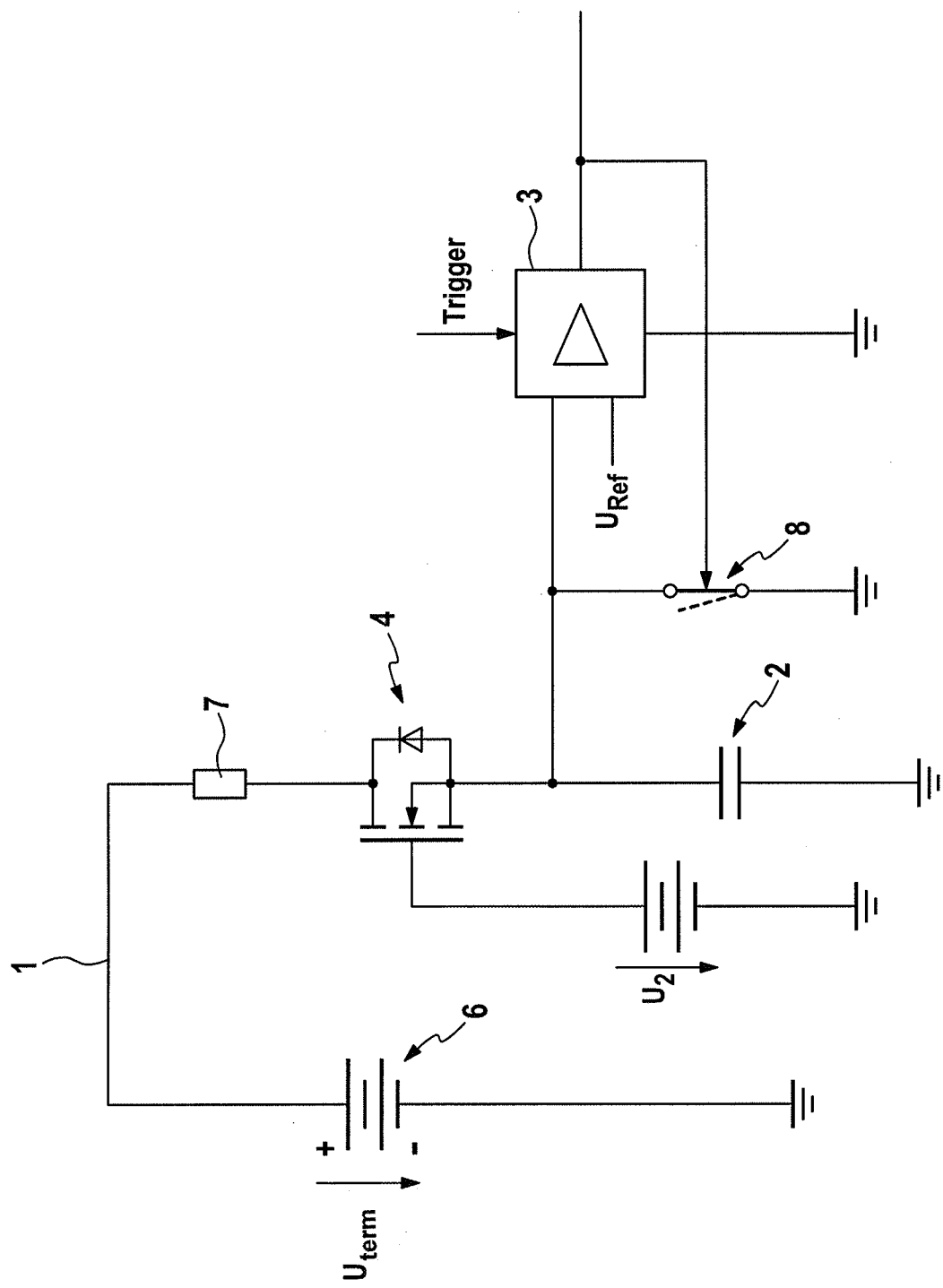

DEVICE FOR MEASURING A SUPPLY VOLTAGE IN ELECTRIC VEHICLES

CROSS REFERENCE TO RELATED APPLICATIONS

This application is the U.S. National Phase Application of PCT/EP2012/055709, filed Mar. 29, 2012, which claims priority to German Patent Application No. 10 2011 006 377.3, filed Mar. 29, 2011, the contents of such applications being incorporated by reference herein.

FIELD OF THE INVENTION

The invention relates to a sensor arrangement for measuring an electrical voltage and the use of the sensor arrangement in motor vehicles.

BACKGROUND OF THE INVENTION

In battery-driven vehicles, it is important to know the state of the battery. This includes measuring the supply or terminal voltage.

The voltage measurement takes place via an ohmic voltage divider having a downstream A/D converter. The challenge lies in the requirement that the battery is loaded with a current that is >10 µA in the power-off state. One way to solve this is to connect an opto-MOSFET in series in order to disconnect the voltage divider from the battery. In addition, the voltage divider ratio increases with increasing battery voltage. This means that at high voltages, the voltage divider ratio must be extremely high, for example, 1000 to 1. For this purpose, many high-resistance resistors are connected in series, which is expensive.

SUMMARY OF THE INVENTION

An aspect of the invention is a sensor arrangement for measuring electrical voltages that is economical and which nevertheless particularly meets the requirements of the automotive field.

This is achieved according to an aspect of the invention by the sensor arrangement for measuring an electrical voltage ($U_{term}$), wherein the potential point at which the electrical voltage relative to a defined electrical potential, in particular relative to ground, is to be measured is connected to a capacitor to which a comparator unit is connected that detects whether a first defined threshold voltage ($U_{Ref}$) is present at the capacitor, wherein the sensor arrangement is configured such that it provides an output signal that is a function of at least one charging process of the capacitor and comprises at least the information about the charging time for charging the capacitor up to the first defined threshold voltage.

The sensor arrangement is also particularly suited for measuring relatively large voltages without having to use a cascaded voltage divider for achieving high resistances, which is expensive.

A capacitor is preferably to be understood to mean a primarily capacitive element.

The sensor arrangement is preferably configured such that it converts the information about the voltage to be measured into a frequency-encoded or pulse width-encoded output signal.

The sensor arrangement preferably has a time measuring unit or is connected to an external time measuring unit with which the time for charging the capacitor is measured.

The electrical voltage to be measured is preferably the terminal voltage of a voltage source that is connected to the sensor arrangement.

The voltage source that is connected to the sensor arrangement preferably has a terminal voltage of at least 100 V, in particular 1000 V or more.

The sensor arrangement preferably has a switch-off element that is configured and connected such that it is able to disconnect the capacitor from the potential point of the electrical voltage to be measured, wherein this switch-off element is particularly configured as a transistor, especially preferably as a field-effect transistor, for example, a MOSFET.

The sensor arrangement is preferably configured such that it has a two-wire interface, in particular a PSI5 interface. The sensor arrangement is especially preferably configured and connected such that it at least is supplied with electrical energy and transmits the output signal via the two-wire interface.

It is preferred that the sensor arrangement is configured such that the voltage to be measured charges the capacitor via an intermediate charging resistor and the capacitor is then discharged, wherein the output signal of the sensor arrangement contains at least the information about the charging time in which the capacitor is charged until the first defined threshold voltage, which is detected by the comparator unit, is reached.

It is advantageous that the comparator unit is configured as a monostable flip-flop that is particularly configured to be triggerable, especially preferably for initializing or starting a measurement process.

It is preferred that the switch-off element is configured and interconnected such that a second reference voltage is present at its control input or switching input or gate/base terminal, and the base point or source/emitter terminal of the switch-off element is connected to the capacitor and approaches the electrical potential at the base point of the second reference voltage during a charging process of the capacitor, and/until the switch-off element then disconnects the capacitor from the potential point of the electrical voltage to be measured.

The sensor arrangement is preferably configured such that the voltage to be measured is applied via at least one intermediate charging resistor to the collector terminal or drain terminal of the switch-off element that is configured as a transistor, wherein in a second reference voltage is applied to the base terminal or gate terminal of the switch-off element that is particularly higher than the first defined threshold voltage, wherein the capacitor is connected to the emitter terminal or source terminal of the switch-off element, and a switch is connected in parallel to the capacitor that is equipped such that it is able to bring about a connection that causes the capacitor to be discharged, and wherein the comparator unit is also connected to the emitter terminal or source terminal of the switch-off element and is equipped such that it detects the voltage at the capacitor and compares it to the first threshold voltage, and in the event that the first threshold voltage is present at the capacitor, actuates the switch so that the capacitor is or can be discharged.

It is preferred that the sensor arrangement is configured such that it can perform measurements in succession in a free-running manner and also that the comparator unit has a fixed hysteresis and is configured in a free-running manner.

It is advantageous that the comparator unit is configured such that it is connected to a supply voltage, wherein in the event that this supply voltage is not available, the sensor arrangement and the comparator unit are configured such that the switch assumes a switching state in which the capacitor can be charged or is not discharged, and that the switch-off element assumes a state such that it disconnects the voltage to be measured from the capacitor.

It is advantageous that the sensor arrangement itself has a computer unit or is connected to a computer unit in which the level of the voltage to be measured is calculated from the charging time that is detected by the time measuring unit.

It is preferred that the at least one charging resistor and the capacitor essentially have equal temperature coefficients and/or an essentially equal temperature response, at least within a defined temperature interval.

It is preferred that the sensor arrangement is configured such that it provides an output signal that encodes each voltage measurement via a pulse whose pulse width is a function of the charging time of the capacitor, in particular, wherein the edges of a pulse are defined by the time points of a trigger signal of the comparator unit at which the voltage measurement starts and at which the voltage is reached at the capacitor according to the first threshold voltage, and/or by the time interval of these time points.

Voltage measurement in the measuring device is preferably no longer performed via an ohmic voltage divider that must be isolated from the battery when the supply voltage is switched off, but rather via a voltage, frequency, or pulse width converter circuit that isolates itself from the voltage source or battery when there is no supply voltage. The voltage information lies in the frequency that can be measured very accurately with a μC. Furthermore, a second A/D converter channel is no longer necessary. In addition, it is possible to transmit the frequency information dynamically to the low-voltage circuit in a manner that is galvanically isolated from the high-voltage battery.

The invention also relates to the use of the sensor arrangement in motor vehicles.

BRIEF DESCRIPTION OF THE DRAWINGS

The invention is best understood from the following detailed description when read in connection with the accompanying drawing. Included in the drawing is the following FIGURE:

FIG. 1 is a schematic representation of an exemplary embodiment of the sensor arrangement.

DETAILED DESCRIPTION OF THE INVENTION

FIG. 1 shows a schematic representation of an embodiment of the sensor arrangement, wherein the voltage present at the potential point 1 relative to ground is measured as the terminal voltage $U_{term}$ of the voltage source 6. The voltage to be measured is applied via at least one intermediate charging resistor 7 to the collector terminal or drain terminal of the switch-off element 4 configured as a MOSFET transistor, wherein a second reference voltage U2 is applied to the base terminal or gate terminal of the switch-off element that is particularly higher than the first defined threshold voltage $U_{Ref}$, wherein the capacitor 2 is connected to the emitter terminal or source terminal of the switch-off element 4 and a switch 8 is connected in parallel to the capacitor that is equipped such that it is able to bring about a connection that causes the capacitor to be discharged. The discharging of the capacitor 2 is induced by the comparator unit 3. The comparator unit 3 is also connected to the emitter terminal or source terminal of the switch-off element 4, and is equipped such that it detects the voltage at the capacitor 2 and compares it to the first threshold voltage $U_{Ref}$ and in the event that the first threshold voltage is present at the capacitor, actuates the switch, so that the capacitor is discharged.

The comparator unit 3 is, for example, configured as a monostable flip-flop that can be triggered via the trigger input to start the measurement process.

The comparator unit 3 is configured such that it is connected to a supply voltage, wherein in the event that this supply voltage is not available in a motor vehicle, for example during "ignition off," the sensor arrangement and the comparator unit are configured such that the switch 8 assumes a switching state in which the capacitor 2 can be charged or is not discharged, that is, it is open, and such that the switch-off element 4 assumes a state such that it disconnects the voltage to be measured from the capacitor. This is achieved by configuring and interconnecting the switch-off element 4 such that the second reference voltage U2 is present at its control input or switching input or gate/base terminal, and the base point or source/emitter terminal of the switch-off element 4 is connected to the capacitor 2 and approaches the electrical potential at the base point of the second reference voltage during a charging process of the capacitor, and/until the switch-off element then disconnects the capacitor 2 from the potential point of the electrical voltage $U_{term}$ to be measured.

The sensor arrangement is configured such that it provides an output signal that encodes each voltage measurement via a pulse whose pulse width is a function of the charging time of the capacitor 2, wherein the edges of a pulse are defined by the time points of a trigger signal of the comparator unit at which the voltage measurement starts and at which the voltage is reached at the capacitor according to the first threshold voltage, or by the time interval of these time points.

The invention claimed is:

1. A sensor arrangement for measuring an electrical voltage ($U_{term}$), the sensor arrangement including:
    a first switch configured to selectively couple a potential point to a node;
    a capacitor coupled to the node;
    a second switch coupled to the node; and
    a comparator coupled to the node;
    wherein the comparator is configured to: 1) close the second switch to couple the capacitor to ground when the comparator detects a voltage at the node that is greater than a first defined threshold voltage ($U_{Ref}$), and 2) open the second switch to de-couple the capacitor from ground when the comparator detects a voltage at the node that is less than the first defined threshold voltage ($U_{Ref}$), and
    wherein the sensor arrangement is configured such that it provides an output signal that is a function of at least one charging process of the capacitor and comprises at least the information about the charging time for charging the capacitor up to the first defined threshold voltage.

2. The sensor arrangement as claimed in claim 1, wherein the sensor arrangement has a time measuring unit or is connected to an external time measuring unit with which the time for charging the capacitor is measured.

3. The sensor arrangement as claimed in claim 1, wherein the electrical voltage to be measured is the terminal voltage ($U_{term}$) of a voltage source that is connected to the sensor arrangement.

4. The sensor arrangement as claimed in claim 1, wherein the sensor arrangement has a switch-off element that is configured and connected such that it is able to disconnect the capacitor from the potential point of the electrical voltage ($U_{term}$) to be measured, wherein the switch-off element is configured as a transistor.

5. The sensor arrangement as claimed in claim 1, wherein the sensor arrangement is configured such that the voltage ($U_{term}$) to be measured charges the capacitor via an intermediate charging resistor and the capacitor is then discharged, wherein the output signal of the sensor arrangement contains at least the information about the charging time in which the capacitor is charged until the first defined threshold voltage ($U_{Ref}$), which is detected by the comparator unit, is reached.

6. The sensor arrangement as claimed in claim 1, wherein the comparator unit is configured as a monostable flip-flop that is configured to be triggerable.

7. The sensor arrangement as claimed in claim 4, wherein the switch-off element is configured and interconnected such that a second reference voltage (U2) is present at its control input, and the base point of the switch-off element is connected to the capacitor and approaches the electrical potential at the base point of the second reference voltage (U2) during a charging process of the capacitor, and the switch-off element then disconnects the capacitor from the potential point of the electrical voltage to be measured.

8. The sensor arrangement as claimed in claim 1, wherein the voltage to be measured is applied via at least one intermediate charging resistor to the collector terminal or drain terminal of the switch-off element that is configured as a transistor, wherein a second reference voltage (U2) is applied to the base terminal or gate terminal of the switch-off element that is higher than the first defined threshold voltage ($U_{Ref}$), wherein the capacitor is connected to the emitter terminal or source terminal of the switch-off element, and a switch is connected in parallel to the capacitor that is equipped such that it is able to bring about a connection that causes the capacitor to be discharged, and wherein the comparator unit is also connected to the emitter terminal or source terminal of the switch-off element and is equipped such that it detects the voltage at the capacitor and compares it to the first threshold voltage, and in the event that the first threshold voltage is present at the capacitor, actuates the switch so that the capacitor is or can be discharged.

9. The sensor arrangement as claimed in claim 1, wherein the sensor arrangement is configured such that it can perform measurements in succession in a free-running manner and also that the comparator unit has a fixed hysteresis and is configured in a free-running manner.

10. The sensor arrangement as claimed in claim 8, wherein the comparator unit is configured such that it is connected to a supply voltage, wherein in the event that this supply voltage is not available, the sensor arrangement and the comparator unit are configured such that the switch assumes a switching state in which the capacitor can be charged or is not discharged, and that the switch-off element assumes a state such that it disconnects the voltage to be measured from the capacitor.

11. The sensor arrangement as claimed in claim 1, wherein the sensor arrangement itself has a computer unit or is connected to a computer unit in which the level of the voltage to be measured is calculated from the charging time that is detected by the time measuring unit.

12. The sensor arrangement as claimed in claim 1, wherein the at least one charging resistor and the capacitor essentially have equal temperature coefficients and/or an essentially equal temperature response, at least within a defined temperature interval.

13. The sensor arrangement as claimed in claim 1, wherein the sensor arrangement is configured such that it provides an output signal that encodes each voltage measurement via a pulse whose pulse width is a function of the charging time of the capacitor, wherein the edges of a pulse are defined by the time points of a trigger signal of the comparator unit at which the voltage measurement starts and at which the voltage is reached at the capacitor according to the first threshold voltage, and/or by the time interval of these time points.

14. The use of the sensor arrangement as claimed in claim 1, in motor vehicles.

\* \* \* \* \*